(12) United States Patent
Schoepp et al.

(10) Patent No.: US 9,982,341 B2
(45) Date of Patent: May 29, 2018

(54) MODULAR VAPORIZER

(71) Applicant: Lam Research Corporation, Fremont, CA (US)

(72) Inventors: Alan M. Schoepp, Ben Lomond, CA (US); Colin F. Smith, Half Moon Bay, CA (US); Edward Sung, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 589 days.

(21) Appl. No.: 14/610,990

(22) Filed: Jan. 30, 2015

(65) Prior Publication Data

US 2016/0222508 A1     Aug. 4, 2016

(51) Int. Cl.
*F22B 1/28* (2006.01)
*C23C 16/448* (2006.01)

(52) U.S. Cl.
CPC .......... *C23C 16/4481* (2013.01); *F22B 1/282* (2013.01)

(58) Field of Classification Search
None
See application file for complete search history.

(56) References Cited

U.S. PATENT DOCUMENTS

| | | | | |
|---|---|---|---|---|
| 3,270,182 A | * | 8/1966 | Hynes | F24H 3/0405 392/478 |
| 3,780,767 A | * | 12/1973 | Borg | F16K 47/08 137/625.3 |
| 3,782,456 A | * | 1/1974 | Gusmer | F28D 7/0041 165/164 |
| 3,882,934 A | * | 5/1975 | Knoos | F28D 9/04 165/164 |
| 4,358,652 A | | 11/1982 | Kaarup | |
| 4,692,592 A | * | 9/1987 | Kale | F24H 1/202 392/450 |

(Continued)

FOREIGN PATENT DOCUMENTS

CN        101191612 A        6/2008
DE        201210200688       7/2013

(Continued)

OTHER PUBLICATIONS

U.S. Appl. No. 14/320,371, filed Jun. 30, 2014, entitled "Configurable Liquid Precursor Vaporizer."

(Continued)

*Primary Examiner* — Thor Campbell
(74) *Attorney, Agent, or Firm* — Weaver Austin Villeneuve & Sampson LLP

(57) ABSTRACT

An improved vaporizer for vaporizing a process fluid is provided. The vaporizer may be assembled from stacked plates and may include one or more plenums with a relatively large wall-area-to-cross-sectional-flow-area ratio. The vaporizer may be equipped with one or more heating elements configured to heat the plenums above the vaporization temperature of the precursor. At least some of the plenums may be heated above the vaporization temperature, but below the Leidenfrost temperature, of the precursor. Multiple stacked plate arrangements may be ganged together in series to achieve complete vaporization, if necessary. The vaporizers may be easily disassembleable for cleaning and maintenance.

23 Claims, 12 Drawing Sheets

(56) References Cited

U.S. PATENT DOCUMENTS

| | | | |
|---|---|---|---|
| 5,265,318 A * | 11/1993 | Shero | B23P 11/025 15/321 |
| 5,356,451 A | 10/1994 | Cain et al. | |
| 6,409,837 B1 | 6/2002 | Hillman | |
| 6,471,782 B1 | 10/2002 | Feng et al. | |
| 6,912,357 B2 | 6/2005 | Bissonnette et al. | |
| 6,952,524 B2 | 10/2005 | Bissonnette et al. | |
| 7,035,532 B2 * | 4/2006 | Kudo | F24H 7/0408 165/10 |
| 7,190,894 B2 | 3/2007 | Chamberlain, Jr. | |
| 7,278,466 B2 * | 10/2007 | Fujisaki | H01L 23/473 165/170 |
| 7,537,047 B2 * | 5/2009 | Lai | H01L 23/4735 165/80.4 |
| 7,730,747 B2 | 6/2010 | Galante et al. | |
| 7,760,993 B2 * | 7/2010 | You | D06F 39/008 392/324 |
| 7,823,543 B2 * | 11/2010 | Nomura | F22G 3/007 122/221 |
| 8,028,664 B2 * | 10/2011 | Kim | A21B 3/04 122/481 |
| 8,107,803 B1 * | 1/2012 | Hannah | A47J 31/4403 392/432 |
| 8,122,736 B2 * | 2/2012 | Martins | F25B 39/04 62/507 |
| 8,463,117 B2 * | 6/2013 | Yeung | F24H 1/106 392/465 |
| 8,554,064 B1 | 10/2013 | Dinh et al. | |
| 8,666,238 B2 * | 3/2014 | Wheeler | F24H 1/121 392/441 |
| 8,724,978 B2 * | 5/2014 | Furumura | F22B 1/28 392/484 |
| 8,821,640 B2 * | 9/2014 | Cleary | C23C 16/4402 118/726 |
| 9,664,412 B2 * | 5/2017 | Sakai | F24H 1/103 |
| 9,676,251 B2 * | 6/2017 | Yokoyama | B60H 1/2221 |
| 2004/0258403 A1 * | 12/2004 | Abras | F24H 1/162 392/480 |
| 2010/0092163 A1 | 4/2010 | Yeung | |
| 2010/0296800 A1 * | 11/2010 | Min | F24H 1/121 392/468 |
| 2011/0048341 A1 | 3/2011 | Zhang et al. | |
| 2015/0352468 A1 * | 12/2015 | Lin | B01D 25/26 210/335 |
| 2015/0377481 A1 | 12/2015 | Smith et al. | |

FOREIGN PATENT DOCUMENTS

| | | |
|---|---|---|
| WO | WO 2002/068713 | 9/2002 |
| WO | WO 2008/061405 A1 | 5/2008 |

OTHER PUBLICATIONS

U.S. Office Action dated May 11, 2016 issued in U.S. Appl. No. 14/320,371.

U.S. Final Office Action dated Dec. 9, 2016 issued in U.S. Appl. No. 14/320,371.

U.S. Advisory Action dated Mar. 31, 2017 issued in U.S. Appl. No. 14/320,371.

U.S. Office Action dated Oct. 30, 2017 issued in U.S. Appl. No. 14/320,371.

Chinese First Office Action dated May 3, 2017 issued in Application No. CN 201510373832.2.

US Ex Parte Quayle Action dated Mar. 15, 2018 issued in U.S. Appl. No. 14/320,371.

* cited by examiner

MODULAR VAPORIZER

BACKGROUND

Certain semiconductor manufacturing processes require precursors to be vaporized before introduction into semiconductor processing chambers. The precursors are often provided in liquid form, thus vaporizers are necessary to vaporize the liquid precursors. Conventional vaporizers often vaporize liquid precursors by spraying the precursor through an atomizer nozzle and then heating the atomized precursor in a heated carrier gas.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In certain implementations, a vaporizer may be provided. The vaporizer may include a first process fluid cap plate with a first inlet configured to flow a first process fluid, a first process fluid first peripheral passage plate with a plurality of first process fluid peripheral passage holes, and a first process fluid first plenum volume. The first process fluid first plenum volume may be bounded, at least in part, by a first surface of the first process fluid cap plate and a first surface of the first process fluid first peripheral passage plate offset from the first surface of the first process fluid cap plate by a first offset distance. The first process fluid first plenum volume may fluidically connect the first inlet and the first process fluid peripheral passage holes. The distance from the first inlet to at least one of the peripheral passage holes may be at least three times greater than the first offset distance.

In some such implementations of the vaporizer, the first process fluid first peripheral passage plate may include a first material with a thermal conductivity above 100 W/m/K.

In some further or additional implementations of the vaporizer, the first material may be CVD silicon carbide, aluminum, and copper.

In some further or additional implementations of the vaporizer, the first process fluid first peripheral passage plate may include a core structure made of a first material and an outer skin made of a second material. The outer skin may be interposed between the core structure and the first process fluid when the first process fluid is flowed through the vaporizer and the second material may be chemically non-reactive with the first process fluid under normal operating conditions of the vaporizer. In some such implementations, the first material may be either copper or aluminum. In some further such implementations, the second material may be a coating that is applied to the core structure.

In some further or additional implementations of the vaporizer, the first process fluid first peripheral passage plate may further include an internal flow inlet fluidically connected to a flow path internal to the first process fluid first peripheral passage plate, an internal flow outlet fluidically connected to the flow path, and the flow path. The flow path may be fluidically interposed between the internal flow inlet and the internal flow outlet, fluidically isolated from the first process fluid peripheral passage holes, and configured to flow a heat transfer fluid through the first process fluid first peripheral passage plate.

In some further or additional implementations of the vaporizer, the vaporizer may further include a first process fluid second plenum volume and a first process fluid first central passage plate with a first process fluid central passage hole. The first process fluid second plenum volume may be bounded, at least in part, by a first surface of the first process fluid first central passage plate and a second surface of the first process fluid first peripheral passage plate that is offset from the first surface of the first process fluid first central passage plate and on a side of the first process fluid first peripheral passage plate opposite the first surface of the first process fluid first peripheral passage plate. The first process fluid second plenum volume may fluidically connect the first process fluid central passage hole and the first process fluid peripheral passage holes. In some such implementations, the vaporizer may further include a first process fluid second peripheral passage plate with a plurality of first process fluid peripheral passage holes and a first process fluid third plenum volume. The first process fluid third plenum volume may be bounded, at least in part, by a second surface of the first process fluid first central passage plate on a side of the first process fluid first central passage plate opposite the first surface of the first process fluid first central plate and a first surface of the first process fluid second peripheral passage plate offset from the second surface of the first process fluid first central passage plate. The first process fluid second plenum volume may fluidically connect the first process fluid central passage holes and the first process fluid peripheral passage holes of the first process fluid second peripheral passage plate.

In some further or additional implementations of the vaporizer, the vaporizer may further include a first heating element configured to heat the first process fluid first peripheral passage plate. In some such implementations, the first heating element may be in thermally-conductive contact with at least a portion of an outer perimeter of the first process fluid first peripheral passage plate.

In some further or additional implementations of the vaporizer, the vaporizer may further include a second process fluid cap plate with a second inlet configured to flow a second process fluid, a second process fluid first peripheral passage plate with a plurality of second process fluid peripheral passage holes, a second process fluid first plenum volume, a first outlet, and an outlet plenum volume. The second process fluid first plenum volume may be bounded, at least in part, by a first surface of the second process fluid cap plate and a first surface of the second process fluid first peripheral passage plate offset from the first surface of the second process fluid cap plate by a second offset distance. The second process fluid first plenum volume may fluidically connect the second inlet and the second process fluid peripheral passage holes. The outlet plenum volume may be a) fluidically interposed between the first process fluid first plenum volume and the second process fluid first plenum volume, b) fluidically interposed between the first process fluid first plenum volume and the first outlet, and c) fluidically interposed between the second process fluid first plenum volume and the first outlet. In some such implementations, the vaporizer may further include a mixer located within the outlet plenum volume. The mixer may include one or more baffles and may be configured to facilitate mixing of the first process fluid and the second process fluid within the outlet plenum volume. In some further such implementations, the vaporizer may further include a second process fluid first central passage plate with a first second gas central passage hole and a second process fluid second plenum volume. The second process fluid second plenum volume may be bounded, at least in part, by a first surface of the second process fluid first central passage plate and a second surface of the second process fluid first peripheral passage plate offset from the first surface of the second process fluid first central passage plate and on a side of the second process fluid first peripheral passage plate opposite the first surface of the second process fluid first peripheral passage plate. The second process fluid second plenum volume may fluidically connect the second process fluid central passage hole and the second process fluid peripheral passage holes. In some further such implementations, the vaporizer may further include a carrier gas source fluidically connected to the second inlet and configured to flow a carrier gas into the second process fluid first plenum volume. In some further such implementations, the vaporizer may further include a second heating element configured to heat the second process fluid first peripheral passage plate.

In some further or additional implementations of the vaporizer, the vaporizer may further include a first spacer interposed between the first process fluid cap plate and the first process fluid first peripheral passage plate. The first spacer may be a thin plate with an opening that forms a continuous perimeter around the first process fluid peripheral passage holes. The first spacer may have a first spacer thickness that defines, at least in part, the first offset distance. In some such implementations, the vaporizer may further include one or more clamping features. The one or more clamping features may be configured to compress the first process fluid cap plate, the first spacer, and the first process fluid first peripheral passage plate together in a stacked arrangement. In some such implementations, the vaporizer may further include a plurality of through-holes. The one or more clamping features may include a plurality of fasteners. Each fastener may include a threaded portion and a fastening portion configured to screw onto the threaded portion. The through-holes may be configured to allow one of the fasteners to pass through. The through-holes may be in the peripheral passage plate, the cap plate, and/or the spacer.

In certain implementations, a vaporizer may be provided. The vaporizer may include a first process fluid cap plate with one or more first inlets configured to flow a first process fluid, a first process fluid first passage plate with one or more first process fluid first passage holes, and a first process fluid first plenum volume. The first process fluid first plenum volume may be bounded, at least in part, by a first surface of the first process fluid cap plate and a first surface of the first process fluid first passage plate offset from the first surface of the first process fluid cap plate by a first offset distance. The first process fluid first plenum volume may fluidically connect the one or more first inlets and the one or more first process fluid first passage holes. The distance from the first inlet to at least one of the first process fluid first passage holes may be at least three times greater than the first offset distance.

In some such implementations of the vaporizer, the first process fluid cap plate may be rectangular and the one or more first inlets may be positioned so as to introduce the first process fluid into the first process fluid first plenum volume at one end of the first process fluid first plenum volume. In some such implementations, the first process fluid first passage plate may be rectangular and the one or more first process fluid first passage holes may be positioned to receive the first process fluid from the first process fluid first plenum volume at an end of the first process fluid first plenum volume opposite from where the one or more first inlets introduce the first process fluid into the first process fluid first plenum volume.

In certain implementations, a system may be provided. The system may include a vaporizer, a first heating element configured to heat the first process fluid first peripheral passage plate, and a controller with one or more processors and a memory, such that the one or more processors, the memory, and the first heating element may be communicatively connected and the memory may store program instructions for controlling the first heating element to heat the first process fluid first peripheral passage plate to a temperature below the Leidenfrost temperature of the first process fluid. The vaporizer may include a first process fluid cap plate with a first inlet configured to flow a first process fluid, a first process fluid first peripheral passage plate with a plurality of first process fluid peripheral passage holes, a first process fluid first plenum volume. The first process fluid first plenum volume may be bounded, at least in part, by a first surface of the first process fluid cap plate and a first surface of the first process fluid first peripheral passage plate offset from the first surface of the first process fluid cap plate by a first offset distance. The first process fluid first plenum volume may fluidically connect the first inlet and the first process fluid peripheral passage holes. The distance from the first inlet to one of the peripheral passage holes may be at least three times greater than the first offset distance.

These and other features of the invention will be described in more detail below with reference to the drawings.

BRIEF DESCRIPTION OF THE DRAWINGS

FIGS. 1, 2, 3, 4, 5, and 7 are drawn to-scale within each Figure, although the scale from Figure to Figure may differ.

DETAILED DESCRIPTION

Figure 1:
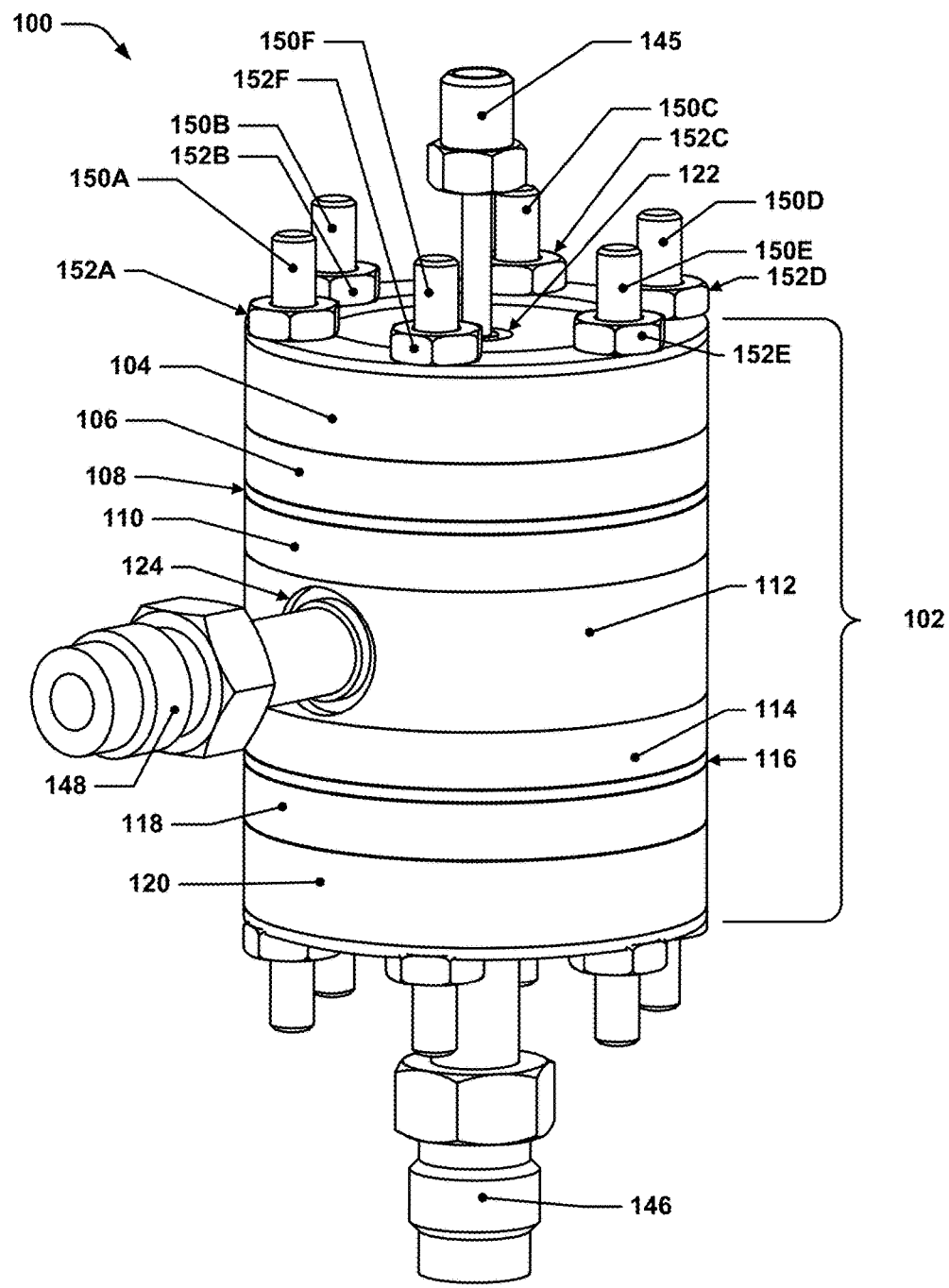
FIG. 1 shows an example vaporizer with a stackable plate arrangement.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

Wafer uniformity is an important factor in the processing of high quality semiconductor wafers. In certain implementations of semiconductor processing, a liquid precursor may need to be evaporated or vaporized before being deposited on a semiconductor wafer. Complete evaporation of the precursor may have a large effect on the processing uniformity of processed semiconductor wafers. The present inventors have determined that many commercial off-the-shelf vaporizers exhibit less than complete vaporization of the precursor.

It is to be understood that, as used herein, the term "semiconductor wafer" may refer both to wafers that are made of a semiconductor material, e.g., silicon, and wafers that are made of materials that are not generally identified as semiconductors, e.g., epoxy, but that typically have semiconductor materials deposited on them during a semiconductor processing. The apparatuses and methods described in this disclosure may be used in the processing of semiconductor wafers of multiple sizes, including 200 mm, 300 mm, and 450 mm diameter semiconductor wafers.

The present inventors have realized that a vaporizer that is configured to flow a precursor through a disk-shaped plenum volume that is heated to a point higher than the vaporization temperature of the precursor, but not above the Leidenfrost temperature for that precursor, may be much more effective and efficient at vaporizing the precursor than conventional vaporizer systems, e.g., vaporizers that utilize an atomizer nozzle to spray the liquid into a fine mist of droplets that are then partially or wholly evaporated by being entrained in a heated gas. The vaporizer detailed in this disclosure may be used with any precursor suitable for use in semiconductor processing, as well as liquids that are not necessarily related to semiconductor manufacturing.

As mentioned above, conventional vaporizers typically function by first atomizing the liquid to be vaporized into a mist of fine droplets that are then heated in a gaseous environment, e.g., entrained in a heated carrier gas. The theory of operation of such conventional vaporizers is that the atomization partitions the liquid into a multitude of smaller portions with a greater surface-area-to-volume ratio than existed in the precursor prior to atomization and that such an increased surface-area-to-volume ratio results in relatively rapid evaporation of the remaining liquid-phase precursor in the heated carrier gas.

Due to the manner in which such conventional vaporizers work, the carrier gas must flow through the vaporizer at relatively high speeds, e.g., 300 m/s. Since the degree of evaporation is based on residence time of the atomized precursor/carrier gas in the heated environment of the vaporizer, the flow path length of the precursor/carrier gas is generally viewed to be determinative of the degree of vaporization experienced. This presents an issue since the atomized precursor/carrier gas mixture flows at a high rate of speed and thus travels through the vaporizers quickly—while residence time can be increased by extending the flow path length, vaporizer manufacturers are typically constrained by the packaging envelopes of semiconductor manufacturing tools, i.e., such manufacturers typically try to minimize size of the vaporizer so as to have more room for other equipment. Most conventional vaporizers are designed such that their flow path lengths, and thus atomized precursor residence times, are sufficiently long enough to theoretically vaporize all of the atomized droplets (without being too long); due to the packaging constraints discussed above, these flow paths are usually not made any longer.

However, such designs typically rely on an average droplet size when such flow path lengths are determined. Since some droplets will be bigger and some smaller in actual practice, the smaller-size droplets will still completely evaporate, but the larger-sized droplets will frequently exit such vaporizers before completely evaporating. Having droplets exit the vaporizer before complete vaporization may lead to wafers experiencing unacceptable amounts of defects due to such incomplete precursor vaporization on the part of a conventional vaporizer. After investigating, the present inventors determined that the conventional vaporizers, while generally advertising 100% vaporization, frequently did not, in general, offer such performance due to the above-discussed apparent reliance on an average droplet size. Moreover, the present inventors realized that the carrier gas was actually a poor heat conductor since thermal conductivity of gases is quite poor as compared to solids. The present inventors previously used techniques such as installing a porous filter in series after the vaporizer to remove many of the remaining droplets. Nonetheless, such filters were unable to completely filter out all of the remaining, unevaporated, droplets, leading to an unacceptable amount of defects. As semiconductor fabrication techniques continue to advance, the number of defects left by leftover, unevaporated droplets became a much more sensitive issue as new fabrication techniques have a lower tolerance for defects.

The present inventors decided to reexamine the fundamental design principles of vaporizers and determined that a vaporizer that flowed the precursor through one or more thin, heated disk-shaped plenum volumes (rather than introducing the precursor to a heated carrier gas environment through atomization) result in more efficient heat transfer to the precursor and thus greater evaporation efficiency than is observed in most conventional vaporizers. Building on this principle, the present inventors realized further that by keeping the temperature of the walls defining the plenum volume to a point lower than the Leidenfrost temperature of the precursor (but above the vaporization temperature), the Leidenfrost effect may be avoided and more efficient evaporation obtained.

The Leidenfrost effect refers to a behavior observed in liquids that are in contact with a heated surface. As the temperature rises above the boiling or evaporation temperature, the liquid starts to evaporate—the rate of evaporation continues to increase with increasing temperature until the Leidenfrost temperature is reached. At this point, a thin layer of the liquid may evaporate such that the resulting gas is trapped between the liquid and the heated surface, forming an insulating layer in between the surface and the liquid. This causes the heat transfer rate to the liquid to drop, and lowers the evaporation rate (even though the temperature of the heated surface has continued to increase).

Thus, the present inventors have realized that by flowing precursor through one or more thin, heated disk-shaped plenum volume, such as a plenum volume that may, for example, flow the precursor a distance that is at least ten times larger than the height or thickness of the plenum volume, heated to a point between the vaporization temperature of the precursor and the Leidenfrost point of the precursor, the precursor (or other liquid to be vaporized) may be vaporized in a much more efficient manner such that true, complete vaporization of the precursor may be achieved in the same, or smaller, overall package volume of a conventional vaporizer.

Various features of such vaporizers are discussed below with respect to various example vaporizer implementations. The vaporizers described herein generally feature a stacked-plate construction, and it is to be recognized that such construction allows such vaporizers to be custom-tailored to suit a variety of different liquids to be vaporized by stacking different numbers of such plates, as needed, in order to achieve a desired vaporization path length within the vaporizer. Such vaporizers may be installed in a semiconductor processing tools and may be used to aid in the delivery of precursors into semiconductor processing chambers. Of course, such vaporizers may also be used in other contexts where vaporization of fluids is desired, and such vaporizers are not restricted to use in semiconductor operations. This disclosure is not to be viewed as describing vaporizers that are only used in semiconductor processing operations, and these principles may be used in a vaporizer used in any type of apparatus in which liquid vaporization is desired.

It is to be understood that, as used herein, the term "process fluid" may refer to a liquid, a gas, or any combination of liquid or gaseous fluids appropriate for substrate processing, including precursors and carrier gas. This disclosure may additionally identify components based on the process fluid that the component is designed to flow. Hence, a first process fluid cap plate may be designed to flow a first process fluid.

FIG. 1 shows an example vaporizer with a stackable plate arrangement. FIG. 1 shows a vaporizer 100 with a stacked plate assembly 102. The stacked plate assembly 102 include a first process fluid cap plate 104, a first process fluid peripheral passage plate 106, a first spacer 108, a first process fluid central passage plate 110, an outlet section 112, a second process fluid central passage plate 114, a second spacer 116, a second process fluid peripheral passage plate 118, and a second process fluid cap plate 120.

The first process fluid cap plate 104 includes a first inlet 122. The outlet section 112 includes a first outlet 124. The first inlet 122 may be connected to a first inlet tube 145 that may be connected to a first process fluid source (not shown). The first outlet 124 may be connected to a first outlet tube 148 that may be connected to a gas delivery apparatus (not shown), e.g., a showerhead assembly or other gas distribution system, of a semiconductor processing tool (not shown). Additionally, the second process fluid cap plate 104 includes a second inlet, not indicated by ordinal indicators in FIG. 1, but indicated as 126 in FIG. 2. The second inlet is connected to a second inlet tube 146 that may be connected to a second process fluid source or a process gas source (not shown).

The stacked plate assembly 102 may be held together through a variety of different mechanisms, for example, by using a plurality of fasteners. Each fastener in FIG. 1 includes a threaded rod and a plurality of nuts. In the vaporizer 100, there are six threaded rods 150A-F and twelve nuts. There are six nuts on top, nuts 152A-F, and six nuts on the bottom, which are not highlighted by ordinal indicators.

Figure 2:
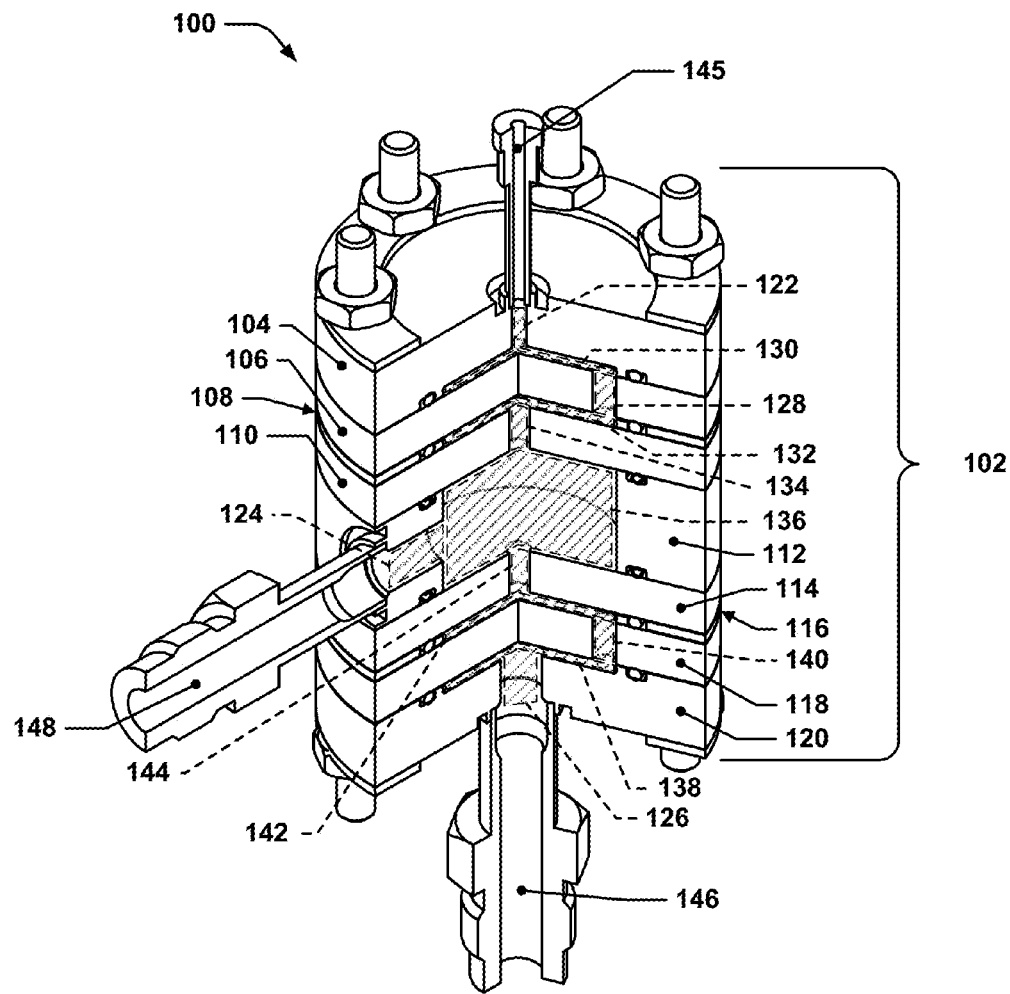
FIG. 2 shows a cutaway view of the example vaporizer of FIG. 1.

The vaporizer 100 shown in FIG. 2 is a cutaway view of the vaporizer shown in FIG. 1 showing the plenum volumes internal to the vaporizer 100.

In FIG. 2, the first inlet 122 is further highlighted. The first inlet 122 is connected to the first inlet tube 145. The first inlet tube 145 may be connected to a first process fluid source (not shown). The first inlet tube 145 may receive a first process fluid from the first process fluid source and flow the first process fluid into the first inlet 122.

From the first inlet 122, the process fluid may then flow into a first process fluid first plenum volume 130. The first process fluid first plenum volume 130 is a disk-shaped plenum volume. One or more of the surfaces bounding the disk-shaped plenum volume may be heated. In the vaporizer 100, process fluid introduced into the first process fluid first plenum volume 130 may flow generally radially outward from the position of the first inlet 122, located centrally, towards that of the first process fluid peripheral passage holes located on the first process fluid peripheral passage plate 106. A first process fluid peripheral passage hole 128 is indicated in FIG. 2, but it is appreciated that in various implementations, the first process fluid peripheral passage plate 106 may include a plurality of first process fluid peripheral passage holes, such as first process fluid peripheral passage holes 128A-F visible in FIG. 3. In certain implementations, a first process fluid peripheral passage plate may contain between 2-16 first process fluid peripheral passage holes.

Referring back to the first process fluid first plenum volume 130, in certain implementations, the top and bottom of the disk-shaped first process fluid first plenum volume 130, the "flat" parts of the disk, may be defined, at least in part, by features of the first process fluid cap plate 104 and the first process fluid peripheral passage plate 106. In the vaporizer 100 of FIG. 2, a first side of the first process fluid cap plate 104 has features that define the top (the part of the first process fluid first plenum volume 130 closer to the first inlet 122) and sides of the first process fluid first plenum volume 130, while a first surface of the first process fluid peripheral passage plate 106 defines the bottom (the part of the first process fluid first plenum volume 130 farther from the first inlet 122) of the first process fluid first plenum volume 130. The features of the first process fluid cap plate 104 that define the sides of the first process fluid first plenum volume 130 also define the height, or offset distance, of the first process fluid first plenum volume 130. In other implementations, the offset distance may be partly or fully defined by a spacer. By contrast, some implementations may not use spacers and may define the offset distance of all plenums through features of the cap plate, peripheral passage plate, central passage plate, or outlet section. Spacers are described in greater detail elsewhere within this disclosure.

In certain implementations, the first process fluid peripheral passage plate 106 may be heated. Heat from the heated first process fluid peripheral passage plate 106 may then be conducted to heat any process fluid within, at least, the first process fluid first plenum volume 130. Heat from the first process fluid peripheral passage plate 106 may be conducted to the first process fluid flowing from the first inlet 122 towards the first process fluid peripheral passage holes 128 of the first process fluid peripheral passage plate 106. The process fluid may be a liquid, a gas, or any combination of liquid or gaseous fluids appropriate for substrate processing, including precursors and carrier gas. If liquids are present in the process fluids, they may be evaporated as they pass through the vaporizer plate stack. In certain other implementations, other parts of the vaporizer 100, such as the first process fluid cap plate 104 and the first process fluid central passage plate 110, may also be heated.

From the first process fluid peripheral passage holes 128, the first process fluid may flow into a first process fluid second plenum volume 132. Similar to the first process fluid first plenum volume 130, the first process fluid second plenum volume 132 is a disk-shaped plenum. One or more of the surfaces bounding the first process fluid second plenum volume 132 may be heated. Process fluid introduced into the first process fluid second plenum volume 132 may flow generally radially inward from the position of the first process fluid peripheral passage holes 128 towards the first process fluid first central passage hole 134 located centrally in the first process fluid central passage plate 110. In certain implementations, the first process fluid peripheral passage plate 106 may also heat process fluid flowing through the first process fluid second plenum volume 132.

In certain implementations, the top and bottom of the disk-shaped first process fluid second plenum volume 132, e.g., the "flat" parts of the disk, may be defined, at least in part, by features of a second surface of the first process fluid peripheral passage plate 106 and a first surface of the first process fluid central passage plate 110. In the implementation shown in FIG. 2, the second surface of the first process fluid peripheral passage plate 106 defines the top of the first process fluid second plenum volume 132, the first surface of the first process fluid central passage plate 110 defines the bottom of the first process fluid second plenum volume 132, and the inner diameter of the first spacer 108 defines the sides of first process fluid second plenum volume 132. It is to be understood that the terms "top" and "bottom," as used herein to describe various aspects of the plenum volumes, are merely used as terms of convenience to describe the relative locations of items with respect to the orientations of the Figures; in actual practice, the vaporizer may be oriented in any number of directions, and the terms "top" and "bottom" are thus somewhat arbitrary.

In the implementation shown, the first spacer 108 defines the height, or offset distance, of the first process fluid second plenum volume 132. In certain implementations, spacers may be used to define the offset distance of plenums. Using spacers may allow flexibility in defining the offset distance, allowing for the offset distance to vary depending on the process fluid being used within the vaporizer. In certain implementations, the offset distance may be determined through factors such as the Reynolds number of the process fluid, the thermal input required to vaporize the process fluid, and the dimensions of the vaporizer. In certain such implementations, a large surface area to plenum volume ratio may be used to aid in the transfer of heat to the process fluid that passes through the plenum volumes. Additionally, the use of spacers may reduce the amount of machining needed for producing one or more of the first process fluid central passage plate 110, the first process fluid peripheral passage plate 106, or other stacked plates within the vaporizer.

From the first process fluid second plenum volume 132, the first process fluid may flow into a first process fluid first central passage hole 134. The first process fluid first central passage hole 134 may be a hole contained within the first process fluid central passage plate 110. The first process fluid may flow through the first process fluid first central passage hole 134 into an outlet plenum volume 136.

The top of the outlet plenum volume 136 in the vaporizer 100 is defined by a second surface of the first process fluid central passage plate 110. The bottom of the outlet plenum volume 136 is defined by a second surface of the second process fluid central passage plate 114, and the sides of the outlet plenum volume 136 is defined by the inner diameter of the outlet section 112.

In addition to the first process fluid, the vaporizer 100 may flow a second process fluid. In certain implementations, the second process fluid may be a process gas, a precursor, a carrier gas, or a combination of one or more of such. The second inlet tube 146 may be connected to a second process fluid source. The second process fluid may flow through the second inlet tube 146 into the second inlet 126. From the second inlet 126, the process fluid may then flow into a second process fluid first plenum volume 138. The second process fluid first plenum volume 138 is a disk-shaped plenum, similar to the first process fluid plenum volumes. The second process fluid cap plate 120 has features that define the bottom (the part of the second process fluid first plenum volume 138 closer to the second inlet 126) and sides of the second process fluid first plenum volume 138, while a first surface of the second process fluid peripheral passage plate 118 defines the top of the second process fluid first plenum volume 138. The features of the second process fluid cap plate 120 that define the sides of the second process fluid first plenum volume 138 also define the offset distance of the second process fluid first plenum volume 138. One or more of the surfaces bounding the second process fluid first plenum volume 138 may be heated.

The second process fluid introduced into the second process fluid first plenum volume 138 may flow generally radially outward from the position of the second inlet 126, located centrally, towards and into that of the second process fluid peripheral passage holes located in the second process fluid peripheral passage plate 118. A second process fluid peripheral passage hole 140 is indicated in FIG. 2, but in various implementations, the second process fluid peripheral passage plate 118 may include a plurality of second process fluid peripheral passage holes. In certain implementations, a second process fluid peripheral passage plate may, similar to the first process fluid peripheral passage plate, contain between 2-16 second process fluid peripheral passage holes 140.

From the second process fluid peripheral passage holes, the process second fluid may flow into a second process fluid second plenum volume 142. Similar to the second process fluid first plenum volume 138, the second process fluid second plenum volume 142 is a disk-shaped plenum and one or more of the surfaces bounding the second process fluid second plenum volume 142 may be heated. The second process fluid introduced into the second process fluid second plenum volume 142 may flow generally radially inward from the position of the second process fluid peripheral passage holes towards the second process fluid first central passage hole 144 located centrally on the second process fluid central passage plate 114. In certain implementations, the second process fluid peripheral passage plate 118 may also heat process fluid flowing through the second process fluid second plenum volume 142.

In certain implementations, the top and bottom of the disk-shaped second process fluid second plenum volume 142 may be defined, at least in part, by features of a second surface of the second process fluid peripheral passage plate 118 and a first surface of the second process fluid central passage plate 114. In the implementation shown in FIG. 2, the second surface of the second process fluid peripheral passage plate 118 defines the bottom of the second process fluid second plenum volume 142, the first surface of the second process fluid central passage plate 114 defines the top of the second process fluid second plenum volume 142, and the inner diameter of the second spacer 116 defines the sides of second process fluid second plenum volume 142.

From the second process fluid second plenum volume 142, the second process fluid may flow into a second process fluid first central passage hole 144. The second process fluid first central passage hole 144 may be a hole contained within the second process fluid central passage plate 114. The second process fluid may flow through the second process fluid first central passage hole 144 into the outlet plenum volume 136.

Returning to the outlet plenum volume 136, in certain implementations, the outlet plenum volume 136 may additionally include a mixer (not shown). The mixer may include one or more baffles or other devices designed to promote even mixing between the first process fluid and the second process fluid. Such devices may induce turbulence or swirl of the first and second process fluids to aid in mixing the process fluids together. Other implementations may alternatively or additionally include filters within the outlet plenum volume 136 to help capture any unvaporized process fluid.

After the process fluids have been mixed in the outlet plenum volume 136, the process fluids may then exit the vaporizer 100 via the first outlet 124 and into the first outlet tube 148.

In various implementations, vaporizers may be constructed with a combination of cap plates, peripheral passage plates, central passage plates, spacers, and outlet sections. Certain implementations of vaporizers may introduce only one process fluid, or may introduce three of more process fluids by varying the geometry of the components of the vaporizer.

Additionally, certain implementations of vaporizers may flow a process fluid through multiple peripheral passage plates and central passage plates. In such implementations, the multiple peripheral passage plates may be used to achieve a desired level of heating of the process fluid. In such implementations, there may be, for example, a cap plate on top, followed by a plurality of peripheral passage plate—central passage plate combinations that may then lead into an outlet section. Such implementations may include multiple plenum volumes. In certain additional implementations that, for example, flow two process fluids, the number of peripheral passage plate—central passage plate combinations used may be different for the stacked plate arrangement used to flow the first process fluid as compared to the stacked plate arrangement used to flow the second process fluid.

For example, an alternative arrangement of such plates may include:

| First process fluid | Cap plate | ↓ Fluid flow direction |
|---|---|---|
| | Spacer/First plenum volume | |
| | Peripheral passage plate | |
| | Spacer/second plenum volume | |
| | Central passage plate | |
| | Spacer/third plenum volume | |
| | Peripheral passage plate | |
| | Spacer/fourth plenum volume | |
| | Central passage plate | |
| Mixing plenum | Outlet section/outlet plenum volume | Fluid flow direction→ |
| Second process fluid | Peripheral passage plate | |
| | Spacer/third volume | |
| | Central passage plate | |
| | Spacer/second plenum volume | |
| | Peripheral passage plate | |
| | Spacer/first plenum volume | Fluid flow direction ↑ |
| | Cap plate | |

As can be seen, the last plate in a stack of plates before outlet section is reached may be either a central passage plate or a peripheral passage plate. Additionally, it is also possible for the cap plate to have multiple inlets and to be followed by a central passage plate, although such arrangements would require multiple fluid connections to the cap plate and would likely be considered undesirable from a reliability or cost perspective.

For illustrative purposes, the following are two example scenarios where the number of heated passage plates needed to fully vaporize a first process fluid and a second process fluid differ. Heated passage plates may include peripheral passage plates, central passage plates, or a combination of peripheral and central passage plates. In the following examples the peripheral and central passage plates are heated and it is assumed that the passage plates used in the following examples have an average heat transfer coefficient of 307 W/m$^2$ C, which corresponds to 0.46 W/plate C. For the sake of conciseness, the individual calculations for the two scenarios are omitted and only the final results will be described.

In scenario A, a first process fluid A flows into the vaporizer at the rate of 1 gram/min while a second process fluid A flows into the vaporizer at the rate of 10 liters per minute. The first process fluid A may be isopropyl alcohol (IPA), which may enter the vaporizer in liquid form. The second process fluid A may be a carrier gas such as N2. Line pressure after the vaporizer, e.g., at the outlet of the vaporizer, described in scenario A is 100 Ton and the fluid inlet temperatures of the vaporizer in scenario A are both 25 C.

From a vapor pressure curve of the first process fluid A, it may be determined that the first process fluid A should be kept at a fluid temperature above 40 C. to prevent the first process fluid A from condensing after leaving the vaporizer in scenario A. For the purposes of scenario A, it is assumed that the first process fluid A will be heated to 5 C. above 40 C. to provide a safety margin. Thus, in scenario A, the first process fluid A must be heated to 45 C. and vaporized.

Heating the first process fluid A to 45 C. would require 0.9 watts, while subsequently vaporizing the first process fluid A would require an additional 12.2 watts. As described, the vaporization of the first process fluid A takes a larger amount of power than the heating of the first process fluid A to 45 C. In the current example, if two heated passage plates, such as a peripheral passage plate and a central passage plate, both heated to temperatures of 49 C. are used, the first process fluid A should exit the vaporizer fully vaporized and at 45 C. At the same time, only 2.8 watts is necessary to raise the temperature of the second process fluid A, which is N2, to the desired exit temperature of 45 C. Such heating can be provided using only one heated passage plate, such as one peripheral passage plate, heated to 45 C.

Accordingly, the vaporizer described in scenario A requires only 3 total peripheral and central passage plates, set to reasonable, e.g., touch-safe, temperatures, to transfer heat to the process fluids and provide for complete vaporization; one each of a peripheral and central passage plate for heating and vaporizing the first process fluid A and one peripheral passage plate for heating the second process fluid A.

In scenario B, a first process fluid B flows at the rate of 20 grams/min while a second process fluid B flows at the rate of 2 liters per minute. The first process fluid B may be octamethylcyclotetrasiloxane (OMCTS), which may enter the vaporizer in liquid form. The second process fluid B may again be a carrier gas such as N2. Line pressure after the vaporizer described in scenario B is 100 Torr and the inlet temperatures of the vaporizer in scenario B is 25 C.

The first process fluid B, OMCTS, is a viscous CVD precursor used to deposit an oxide film on Si wafers. As compared to IPA, OMCTS has a lower vapor pressure and a large heat of vaporization. It may also be desirable to not excessively heat OMCTS as undesirable decomposition may occur.

From a vapor pressure curve of the first process fluid B, it is determined that the first process fluid B should be kept at a fluid temperature above 112 C. to prevent the first process fluid B from condensing after leaving the vaporizer in scenario B. For the purposes of scenario B, the first process fluid B will be heated to 5 C. above 112 C. to provide a safety margin.

In scenario B, the first process fluid B must be heated to 117 C. and vaporized; the second process fluid B must also be heated to 117 C. Heating the first process fluid B to 112 C. would require 30 watts, while subsequently vaporizing the first process fluid B would require an additional 63 watts. This is almost 6 times the energy required to heat and vaporize the first process fluid A in scenario A. Such energy may be provided through one high-temperature heated passage plate, or distributed across multiple, lower-temperature heated passage plates, such as multiple heated peripheral and central passage plates. The following table shows the temperatures that the heated passage plates used in the vaporizer in scenario B will need to be heated to versus the number of heated passage plates used for heating and vaporizing the first process fluid B:

| # of Heated Passage Plates | Required outer wall temperature of heated passage plates needed to fully vaporize first process fluid B |
|---|---|
| 1 | 273 C. |
| 2 | 172 C. |
| 3 | 138 C. |
| 4 | 121 C. |

Although the required heat transfer may be achieved with only one heated passage plate, the surface temperature of that heated passage plate, i.e., 273 C., may cause an undesired decomposition reaction in the first process fluid B at the wall surface. With the modular design, the vaporizer may instead be configured to include a larger number of heated passage plates to keep the surface temperature of the heated passage plates at a temperature lower than the decomposition temperature. In scenario B, heating the first process gas B using four heated passage plates with surface temperatures of 121 C. may be desirable in order to avoid undesired decomposition reactions.

In contrast to the multiple peripheral passage plates required to heat the first process gas B, the second process fluid B, which is N2 in this example, only requires 4 watts in scenario B to raise the temperature of the second process fluid B to 117 C., which may still be easily achieved with only a single heated passage plate, such as a single peripheral passage plate, heated to 117 C. Accordingly, the vaporizer described in scenario B requires a total of 5 heated passage plates, 4 for the first process fluid B and 1 for the second process fluid B, to transfer heat to the process fluids without excessive heated passage plate wall temperatures.

Figure 3:
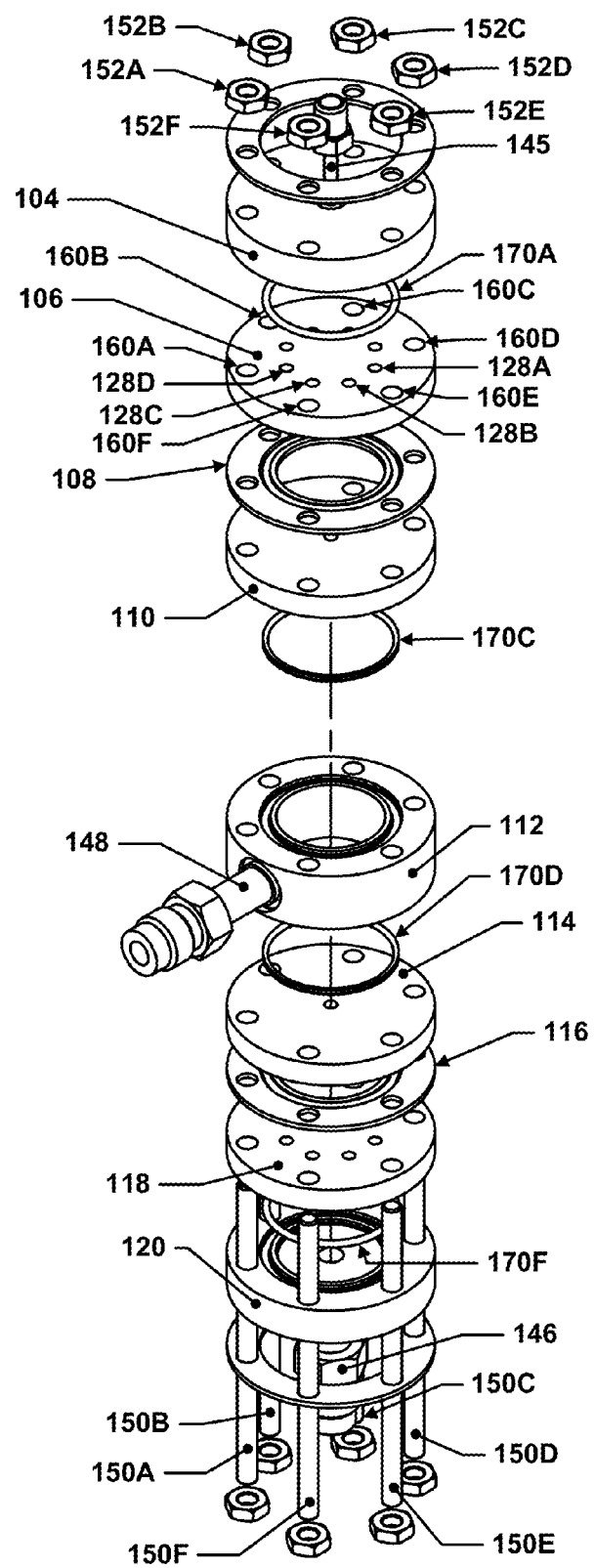
FIG. 3 shows an exploded view of the example vaporizer of FIG. 1.

The above examples are provided with reference to a vaporizer of substantially the same design as shown in FIGS. 1 through 3. For the purposes of this example, the following dimensional values provide context for the above discussion:

| Dimension | Value (inches) |
|---|---|
| Outer diameter of peripheral passage plates, central passage plates, spacers, outlet section | 2 |
| Inner diameter of spacers/outlet section | 1 |
| Plenum/spacer thickness | 0.05 |
| Peripheral passage hole diameter | 0.125 |
| Central passage hole diameter | 0.125 |
| Peripheral passage/central passage plate thickness | 0.25 |
| Cap plate thickness (not including offset) | 0.375 |
| First process fluid inlet inner diameter | 0.09 |
| Second process fluid inlet inner diameter | 0.25 |
| Outlet section height/thickness | 0.6 |
| Outlet diameter | 0.25 |

It is to be understood that any number of different fluids may be vaporized using vaporizers as discussed above; the vaporizer may be tailored to suit the requirements of a particular fluid by changing the number of heated passage plates used for each fluid and the temperature setpoint for the heater used for each heated passage plate. The modular nature of the above system allows for rapid and easy reconfiguration depending on the specific needs of a given process.

FIG. 3 shows an exploded view of the example vaporizer of FIG. 1. FIG. 3 shows that the vaporizer 100 may be assembled from multiple component parts. FIG. 3 illustrates that the vaporizer 100 may be assembled by stacking multiple cap plates, peripheral passage plates, central passage plates, spacers, outlet sections, and other components together to form the vaporizer 100.

Fasteners may be used to hold the assembled vaporizer 100 together. In FIG. 3, the cap plates, peripheral passage plates, central passage plates, spacers, and outlet section may include through-holes near the outside perimeter of the respective components to allow the threaded rods 150A-F to pass through. Such through holes are highlighted on the first process fluid peripheral passage plate 106 as first process fluid peripheral passage plate through-holes 160A-F. Once assembled by passing the threaded rods 150A-F through the through-holes of the various plates, spacers, and outlet sections, nuts 152A-F may be threaded to the threaded rods to hold the entire assembly together. In certain implementations, bolts, clamps, screws, and other disassemble-able fasteners may be used in lieu of or in addition to the threaded rods. Additionally, other implementations may lack through-holes for the fasteners in one, some, or all of the plates, spacers, and outlet sections. In such implementations the parts of the stackable assembly that lack through-holes may be assembled and held in place through friction force or clamping force.

In addition to the components described in FIGS. 1 and 2, the vaporizer 100 may also include other components as illustrated in FIG. 3. For example, vaporizer 100 includes seals. Seals 170A, 170C, 170D, and 170F are shown in FIG. 3 and may be located by various features on the plates, spacers, and outlet sections, to help seal the plenum volumes and prevent leaking of the process fluids. The vaporizer 100 in FIG. 3 may also include seals 170B and 170E that are not shown in FIG. 3, although their seal grooves are visible in the Figure. Other implementations may contain seals of various designs in various configurations.

Figure 4:
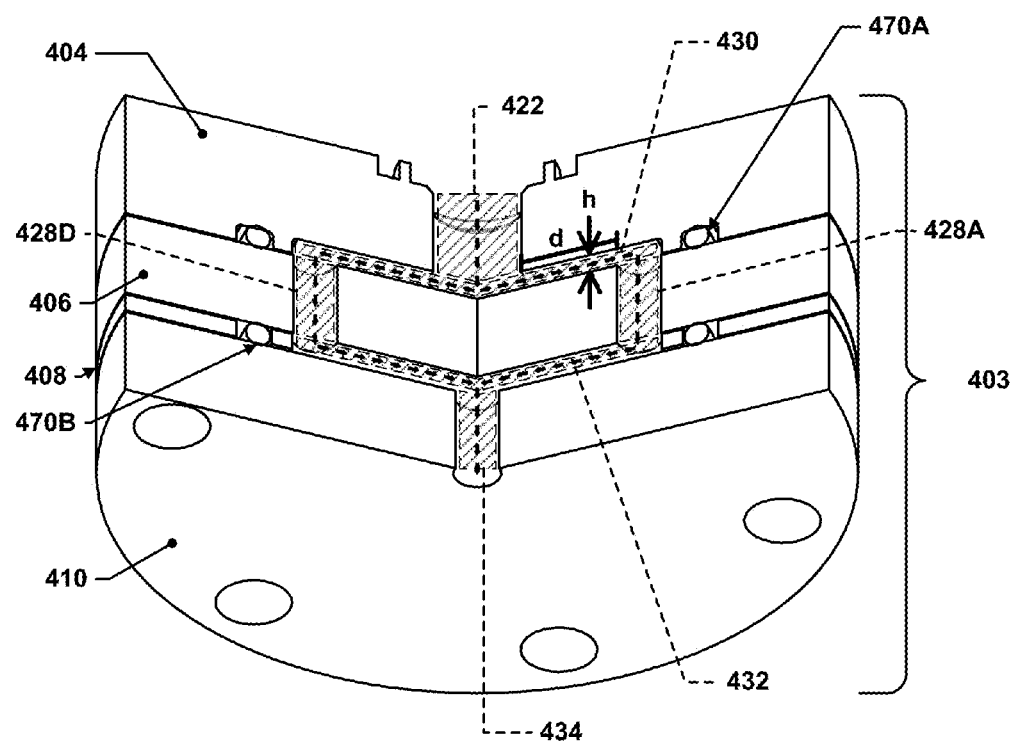
FIG. 4 shows an example stackable plate arrangement of a cap plate, a peripheral passage plate, and a central passage plate.

As previously described, the vaporizer 100 may be assembled from various "stacks." Such a "stack" is shown in FIG. 4. FIG. 4 shows an example stackable plate arrangement of a cap plate, a peripheral passage plate, and a central passage plate. The stackable plate arrangement 403 includes a cap plate 404, a peripheral passage plate 406, a spacer 408, and a central passage plate 410. The stackable plate arrangement 403 additionally includes seals 470A and 470B to help seal the plenum volumes and prevent leakage of the process fluid from the plenum volume.

The cap plate 404 includes a first inlet 422. The features of the cap plate 404 and a first side (the side closer to the cap plate 404) of the peripheral passage plate 406 form the first plenum volume 430. The peripheral passage plate 406 additionally includes a plurality of peripheral passage holes, include peripheral passage holes 428A and 428D. The features of a second side (the side closer to the central passage plate 410) of the peripheral passage plate 406, the spacer 408, and the central passage plate 410 form the second plenum volume 432. The central passage plate 410 additionally includes the central passage hole 434.

In FIG. 4, the arrows illustrate possible flow paths of a process fluid. The process fluid may first flow into the first inlet 422 and then flow through the first inlet 422 to reach the first plenum volume 430. From the center of the first plenum volume 430, the process fluid may flow generally radially outward towards the peripheral passage holes 428. After the process fluid has flowed into and through the peripheral passage holes 428, the process fluid may then flow generally radially inward from the peripheral passage holes 428 to the central passage hole 434 through the second plenum volume 432.

In certain implementations, a first distance defined as the distance from the inlet or central passage hole to any one of the peripheral passage holes of a plenum volume may be at least 3 times greater than the offset distance of the plenum volume. An example first distance "d" is illustrated in FIG. 4. FIG. 4 also illustrates an example offset distance "h." In certain implementations, the first distance may be between 3 to 10 times, 10 to 20 times, or 20 to 50 times greater than the offset distance of the plenum volume.

Figure 5:
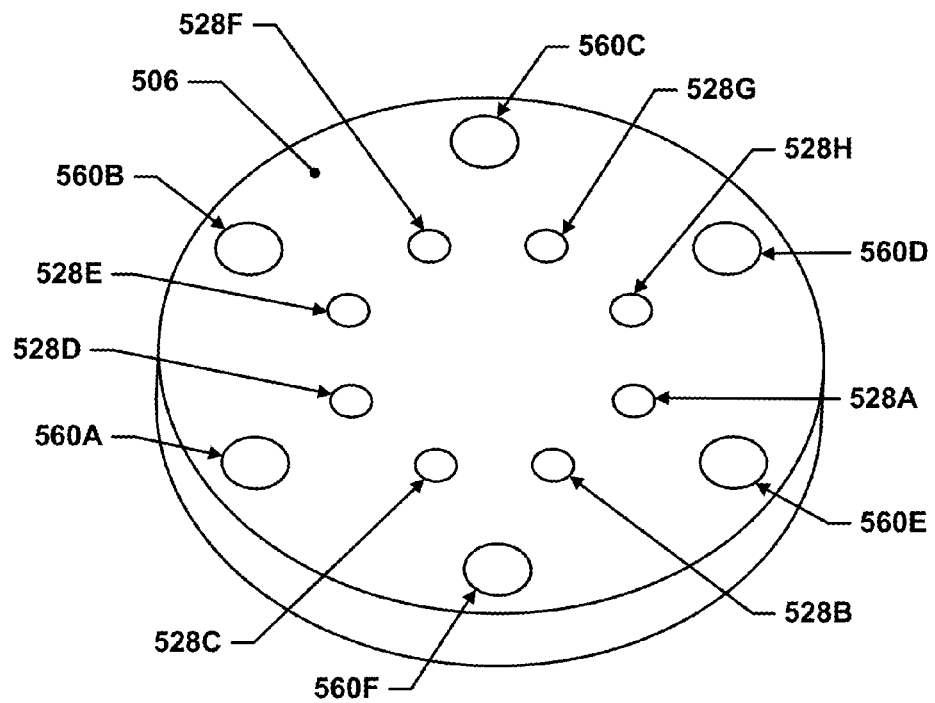
FIG. 5 shows an example peripheral passage plate.

The peripheral passage plate is described in greater detail in FIG. 5. FIG. 5 shows an example peripheral passage plate. The peripheral passage plate 506 includes peripheral passage holes 528A-H (for fluid conveyance) and peripheral passage plate through-holes 560A-H (for fasteners to hold the plate stack together). In various other implementations, the number of peripheral passages holes as well as the number of peripheral passage plate through-holes may vary.

The peripheral passage plate 506 may be fully or partially made from a first material. In certain implementations, the first material may have high thermal conductivity, such as a thermal conductivity above 100 W/(m*K). Examples of suitable first materials include silicon carbide such as chemical-vapor deposition (CVD) silicon carbide, aluminum, copper, molybdenum, nickel, platinum, tungsten. In certain other implementations, the peripheral passage plate 506 may, instead of being fully made from the first material, be made from a core of either the first material or a second material different from the first material and have an outer skin of either the second material or the first material, respectively. In other implementations, the peripheral passage plate may be made from one material with a coating of a second material. In the implementations above, the material on the outside of the peripheral passage plate 506 may be chemically non-reactive with any process fluid used in the vaporizer. The various constructions described for the peripheral passage plate 506 may also be used for cap plates, central passage plates, and other components of the vaporizer. The second material, if used, may also have a high thermal conductivity, such as a thermal conductivity above 100 W/(m*K).

In certain implementations, the peripheral passage plate 506 may be made from materials that are too difficult or impossible to machine in an economical manner, such as CVD silicon carbide. In such implementations, the amount of machining used to manufacture the peripheral passage plate 506 may be minimized, such as being limited to the drilling of holes. The peripheral passage plate 506 may also be manufactured from processes that "print" the peripheral passage plate 506, such as CVD. Many items discussed below with respect to FIGS. 6A-E are common to all of these Figures and may not be described multiple times for the sake of brevity; items indicated with the same callout numbers from Figure to Figure are identical and serve the same function in each implementation, unless indicated otherwise.

Figure 6A:
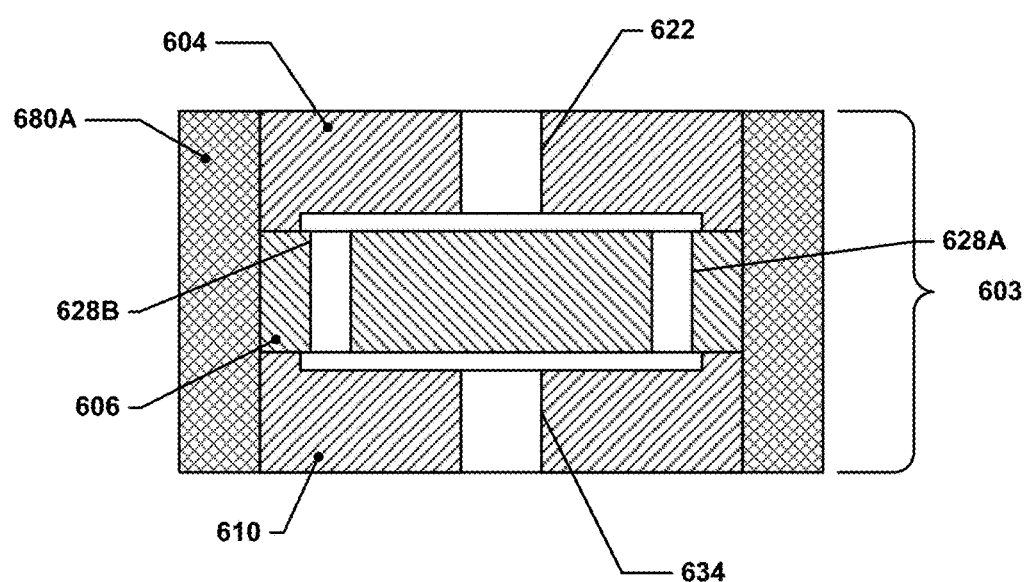
FIG. 6A shows a simplified section view of a configuration of a stackable plate arrangement of a cap plate, a peripheral passage plate, and a central passage plate with a heating jacket.

The material of the peripheral passage plate may be selected to increase thermal conductivity and, thus, heat transfer to any process fluid within the plenums. The peripheral passage plates, as well as other components of the vaporizer, may be heated through various ways. FIG. 6A shows a simplified section view of a configuration of a stackable plate arrangement of a cap plate, a peripheral passage plate, and a central passage plate with a heating jacket. FIG. 6A shows one possible arrangement to heat the vaporizer.

FIG. 6A shows a stackable plate arrangement 603 with a cap plate 604, a peripheral passage plate 606, a central passage plate 610, and a heating element 680A. The cap plate 604 includes a first inlet 622, the peripheral passage plate 606 includes peripheral passage holes 628A and 628B, and the central passage plate 610 includes a central passage hole 634.

The heating jacket 680A surrounds the outer perimeter of all three of the cap plate 604, the peripheral passage plate 606, and the central passage plate 610. In such an implementation, all three of the cap plate 604, the peripheral passage plate 606, and the central passage plate 610 may each conduct heat from the heating jacket 680 A to the process fluid flowing through the stack.

The heating jacket 680 A may be an electronic heating jacket. In certain implementations, there may be a gap filler substance between the heating jacket and one or more of the cap plate, the peripheral passage plate, and the central passage plate to increase heat transfer between the heating jacket and the aforementioned components. The heating jacket 680A may be attached to the outer perimeter of the vaporizer by clamps, screws, or other attachment mechanisms.

Figure 6B:
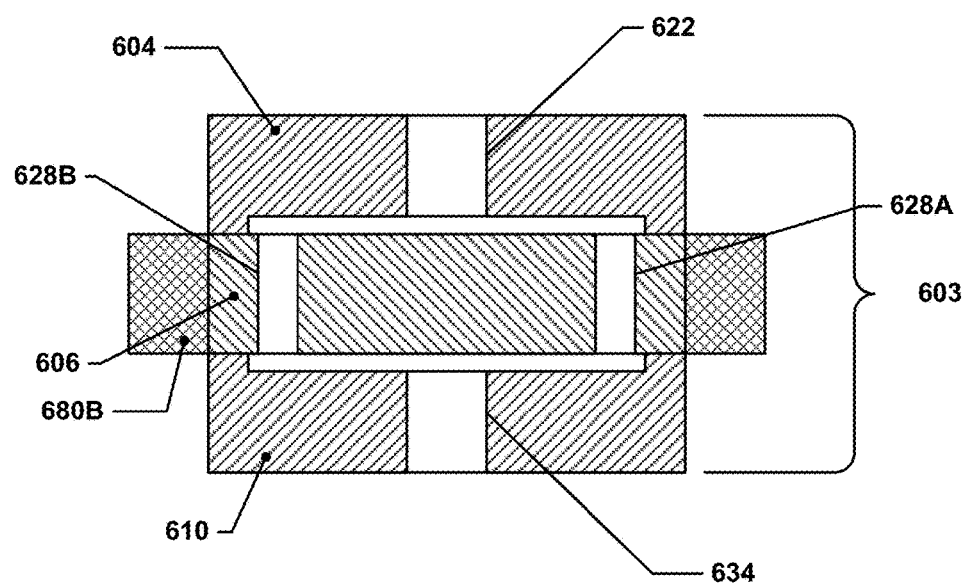
FIG. 6B shows a simplified section view of another configuration of a stackable plate arrangement of a cap plate, a peripheral passage plate, and a central passage plate with a heating jacket.

FIG. 6B shows a simplified section view of another configuration of a stackable plate arrangement of a cap plate, a peripheral passage plate, and a central passage plate with a heating jacket. The configuration shown in FIG. 6B is similar to the configuration shown in FIG. 6A, though the heating jacket 680B in FIG. 6B surrounds the outer perimeter of just the peripheral passage plate 606. In the implementation shown in FIG. 6B, the heating jacket 680B may conduct heat to the peripheral passage plate 606. The peripheral passage plate 606 may then conduct heat to other parts of the vaporizer. Such an arrangement may be useful when it is desirable to heat different plenum volumes within the vaporizer to different temperatures—if each peripheral passage plate and/or central passage plate is heated using a different heater unit, then it is possible to direct different amounts of heat into each such plate, resulting in differently-heated plenum volumes.

Figure 6C:
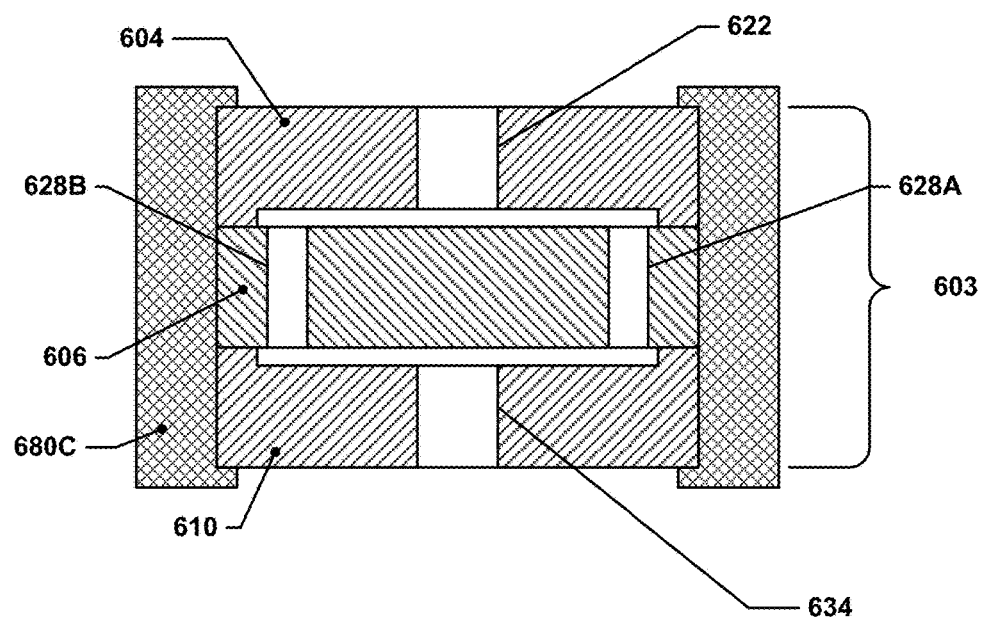
FIG. 6C shows a simplified section view of yet another configuration of a stackable plate arrangement of a cap plate, a peripheral passage plate, and a central passage plate with a heating jacket.

FIG. 6C shows a simplified section view of yet another configuration of a stackable plate arrangement of a cap plate, a peripheral passage plate, and a central passage plate with a heating jacket. The configuration shown in FIG. 6C is similar to the configuration shown in FIG. 6A, though the heating jacket 680 C in FIG. 6C is rigid and also serves as a clamp for clamping together the cap plate 604, the peripheral passage plate 606, and the central passage plate 610. Such a heating jacket may be used in lieu of, or in addition to, fasteners to hold together some or all of the stacked plates of the vaporizer.

Figure 6D:
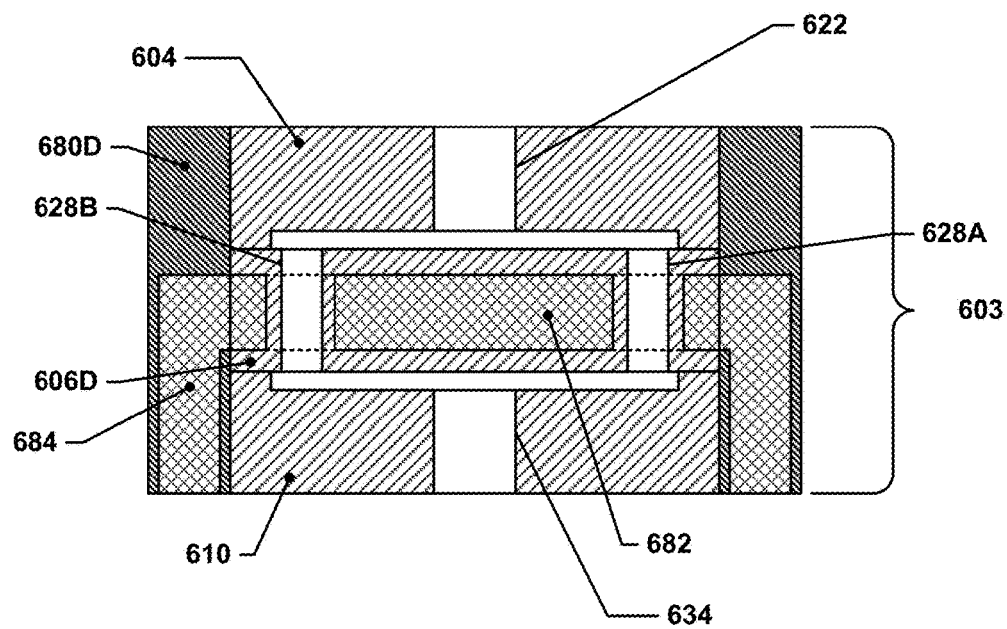
FIG. 6D shows a simplified section view of a further configuration of a stackable plate arrangement of a cap plate, a peripheral passage plate, and a central passage plate with a heating jacket.

FIG. 6D shows a simplified section view of a further configuration of a stackable plate arrangement of a cap plate, a peripheral passage plate, and a central passage plate with a heating jacket. The configuration shown in FIG. 6D is similar to the configuration shown in FIG. 6A, though the heating jacket 680 D in FIG. 6D includes an interior channel (illustrated as a cross-hatched area) where a heat transfer fluid may be flowed through. The peripheral passage plate 606D may also have an interior channel 682 (also illustrated on the peripheral passage plate 606D as a cross-hatched area) through which the heat transfer fluid from the heating jacket 680D may flow. The heat transfer fluid may flow from a first part of the interior channel 684 located within the heating jacket 680D into the interior channel 682 of the peripheral passage plate 606D and out to a second part of the interior channel 684 located within the heating jacket 680D. The heat transfer fluid may be provided by a heat transfer fluid source. The heat transfer fluid may transfer heat to the peripheral passage plate 606D. The heat may then be conducted to any process fluid flowing through the adjacent plenums within the vaporizer.

Figure 6E:
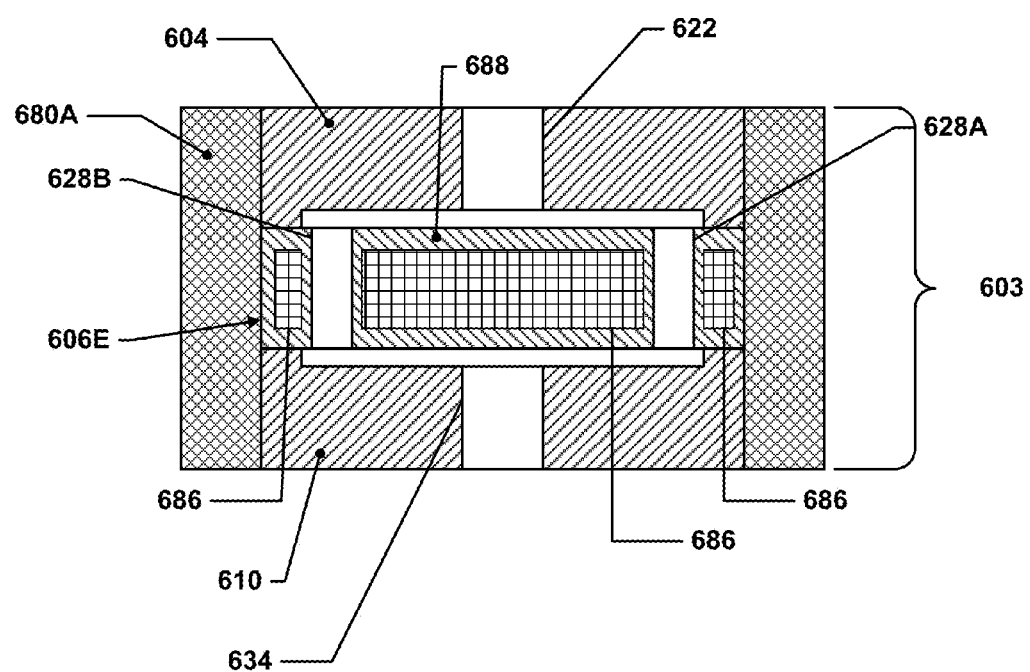
FIG. 6E shows a simplified section view of a yet further configuration of a stackable plate arrangement of a cap plate, a peripheral passage plate, and a central passage plate with a heating jacket.

FIG. 6E shows a simplified section view of a yet further configuration of a stackable plate arrangement of a cap plate, a peripheral passage plate, and a central passage plate with a heating jacket. The configuration shown in FIG. 6E is similar to the configuration shown in FIG. 6A, though the peripheral passage plate 606E includes a core 686 (illustrated by box cross-hatches) that is a different material from the outside of the skin 688 of the peripheral passage plate 606E. In certain implementations, the core 686 may be cast into the skin 688. Such a configuration may allow for a core that uses a material with superior heat transfer characteristics to be used. In such situations, the core material may chemically react with a process fluid used in the vaporizer, thus a skin of a second material that may not chemically react with the process fluid may be used to form the outside of the peripheral passage plate 606E. For example, the skin may be a silicon nitride coating applied to the core material.

Figure 7:
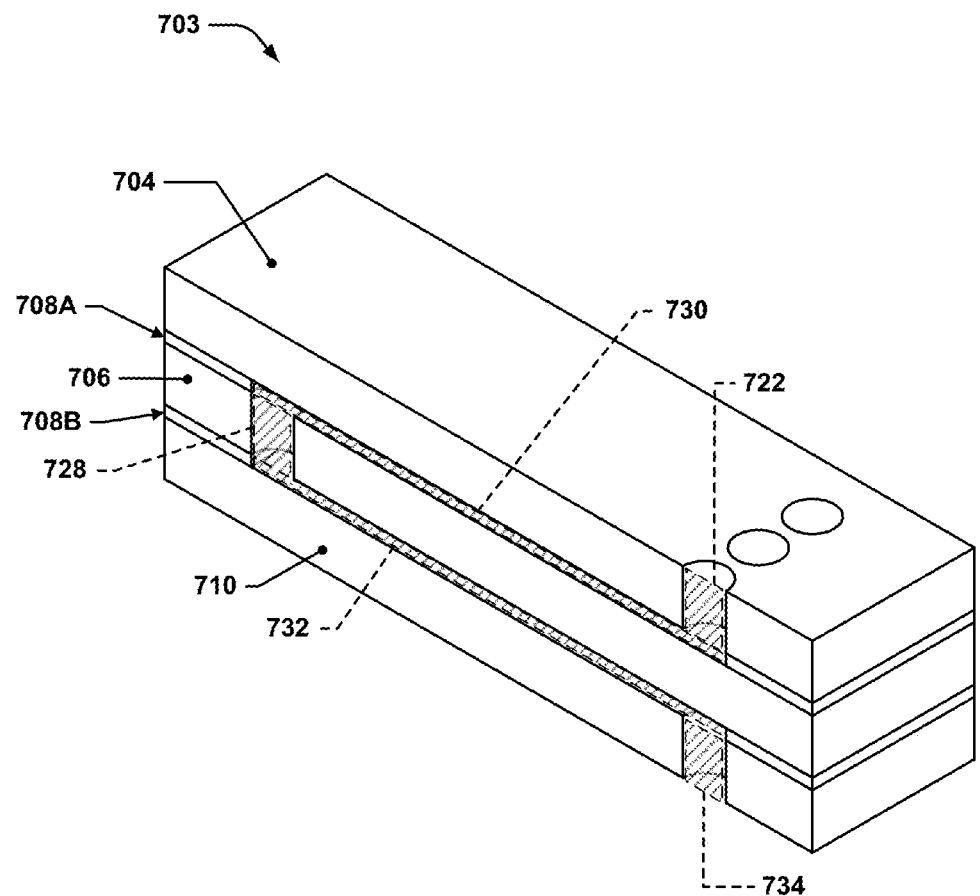
FIG. 7 shows a simplified section view of an example of a stackable plate arrangement of a rectangular cap plate, a rectangular peripheral passage plate, and a rectangular central passage plate.

Previous examples have detailed cylindrical or radially-symmetric vaporizers, but the concepts discussed herein may also be practiced with vaporizers using other geometries such as rectilinear vaporizers. FIG. 7 shows a stackable plate arrangement that may be used in a rectilinear vaporizer. FIG. 7 shows a simplified section view of an example of a stackable plate arrangement of a rectangular cap plate, a rectangular peripheral passage plate, and a rectangular central passage plate. The FIG. 7 shows a cutaway of a rectangular stackable plate arrangement 703. The rectangular stackable plate arrangement 703 includes a rectangular cap plate 704, a first spacer 708 A, a rectangular passage plate 706, a second spacer 708 B, and a rectangular passage plate 710. The rectangular cap plate 704 includes multiple first inlets such as first inlet 722, the rectangular passage plate 706 includes multiple passage holes such as passage hole 728, the rectangular passage plate 710 includes multiple passage holes such as passage plate passage hole 734. The rectangular cap plate 704, the first spacer 708A, and the rectangular passage plate 706 define a first plenum volume 730. The rectangular passage plate 706, the second spacer 708B, and the passage plate 710 define a second plenum volume 732.

In contrast to the stackable plate arrangement 403 in FIG. 4, the rectangular stackable plate arrangement 703 is rectangular rather than disk-shaped. In certain implementations, the first inlet 722 may be positioned at a first end of the rectangular stackable plate arrangement 703. In such an implementation, process fluid may flow from the first inlet 722, through the first plenum volume 730, to the first passage hole 728. In certain implementations, the first passage hole 728 may be positioned at a second end of the rectangular stackable plate arrangement 703. In certain such implementations, the second end may be an end opposite the first end.

From the first passage hole 728, process fluid may then flow through the second plenum volume 732 to the passage plate passage hole 734. In certain implementations, the passage plate passage hole 734 may also be positioned at the first end of the rectangular stackable plate arrangement 703.

In certain other implementations of the rectangular stackable plate arrangement, the first inlet may be located in a central position. In such implementations, the passage holes may be located around some or all of a periphery of the rectangular passage plate. In certain such implementations, the passage plate passage hole may be centrally located, though other implementations may have a passage plate passage hole or multiple passage plate passage holes located elsewhere on the passage plate.

Figure 8:
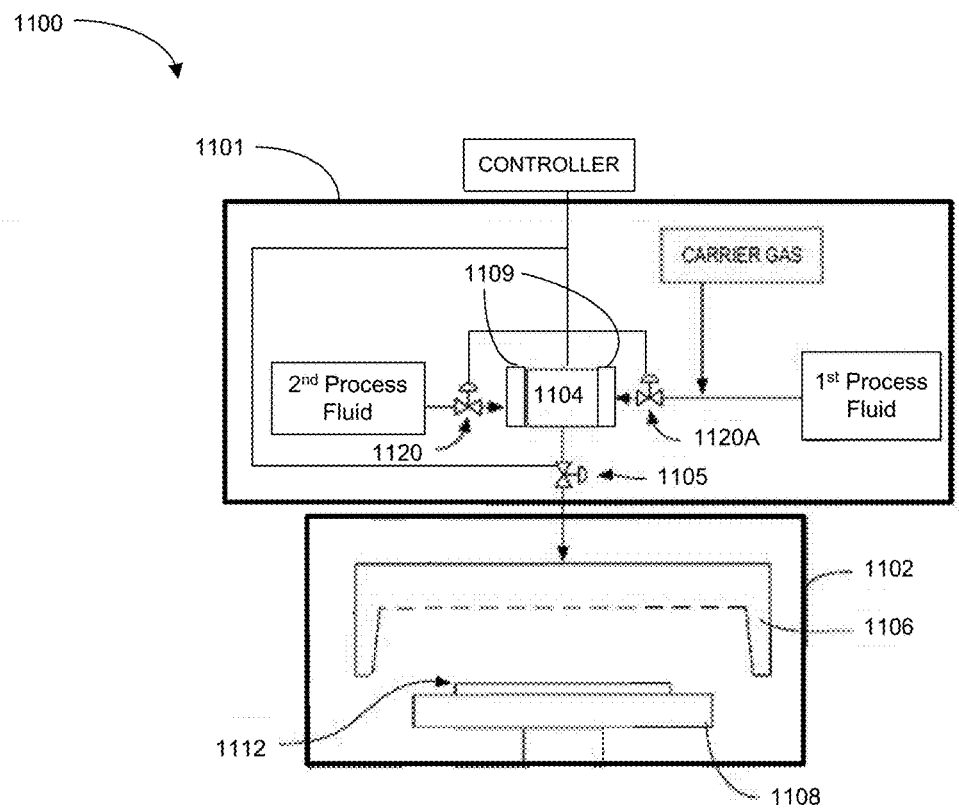
FIG. 8 is a schematic of a substrate processing apparatus having a processing chamber with a single process station.

FIG. 8 is a schematic of a substrate processing apparatus having a processing chamber with a single process station. For simplicity, processing apparatus 1100 is depicted as a standalone process station having a process chamber body 1102 for maintaining a process environment; a vaporizer 1104 may be used to supply process fluid(s) to the process chamber body 1102 to facilitate semiconductor processing operations. However, it will be appreciated that a plurality of process stations may be included in a common process tool environment—e.g., within a common reaction chamber. In configurations featuring a plurality of process stations, each individual process station may have process fluid(s) supplied by an individual vaporizer. In other configurations, process fluid(s) may be provided to the plurality of process stations through one shared vaporizer or a plurality of shared vaporizers. Further, it will be appreciated that, in some implementations, one or more hardware parameters of processing apparatus 1100, including those discussed herein, such as process fluid flow rate, inlet temperature, outlet temperature, heater temperature, etc., may be adjusted programmatically by one or more system controllers.

In some implementations, a controller may be a part of a system, which may be part of the examples described herein. Broadly speaking, the controller may be defined as electronics having various integrated circuits, logic, memory, and/or software that receive instructions, issue instructions, control operation, enable cleaning operations, enable endpoint measurements, and the like. Program instructions may be instructions communicated to the controller in the form of various individual settings (or program files), defining operational parameters for carrying out a particular process.

Referring back to FIG. 8, process station 1100 fluidly communicates with process fluid delivery system 1101 for delivering process fluids to a distribution showerhead 1106. Process fluid delivery system 1101 includes a vaporizer 1104 for blending and/or conditioning process fluids for delivery to showerhead 1106. One or more vaporizer inlet valves 1120 may control introduction of process fluids to the vaporizer 1104.

Some process fluids may be stored in liquid form prior to vaporization and subsequent delivery to the process chamber 1102. The implementation of FIG. 8 includes a vaporizer 1104 that may be heated. In some implementations, the vaporizer 1104 may be in thermally conductive contact with a heating element 1109. The heating element may heat the vaporizer to a temperature sufficient to vaporize at least a portion of any liquid precursor flowing through the vaporizer. Operation of the heating element 1109 may be controlled by the controller.

Showerhead 1106 distributes process fluids toward substrate 1112 at the process station. The flow rate of the process fluids may be controlled by one or more valves upstream from the showerhead (e.g., valves 1120, 1120 A, and 1105). In the implementation shown in FIG. 8, substrate 1112 is located beneath showerhead 1106, and is shown resting on a pedestal 1108.

The equipment described herein may be connected, as discussed above, with various other pieces of equipment, e.g., a semiconductor process chamber, in a semiconductor processing tool. Typically, as previously described, a vaporizer such as that described herein may be connected with a controller, which may be part of the vaporizer or a separate component in communicative contact with various elements of the vaporizer such as, for example, the heating elements discussed above and/or flow controllers or valves for controlling precursor flow, carrier gas flow, purge flow, and/or vacuum application. Such a controller may include one or more processors and a memory that stores instructions for controlling the vaporizer, including the heating elements and potentially other vaporizer-related equipment (such as flow controllers and/or valves) to provide a desired degree of vaporization of a precursor for a given semiconductor process. The instructions may include, for example, instructions to control the heating elements to maintain a desired wall temperature of the passage plates and/or the cap plate (such temperatures may be monitored through the use of thermocouples that may be inserted into the vaporizer plate or the heating platens, or other temperature sensors that may be used to obtain feedback regarding the estimated wall temperature of the channels), to control the velocity at which to flow the process fluid and/or carrier gas, and to control any additional heating elements. As discussed above, the controller may typically include one or more memory devices and one or more processors configured to execute the instructions such that the apparatus will perform a method in accordance with the present disclosure. Machine-readable media containing instructions for controlling process operations in accordance with the present disclosure may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure. Vaporizers are also described in detail in U.S. patent application Ser. No. 14/320,371, filed Jun. 30, 3014, titled "CONFIGURABLE LIQUID PRECURSOR VAPORIZER", which is hereby incorporated by reference in its entirety.

What is claimed is:

1. A vaporizer comprising:
   a first process fluid cap plate with a first inlet configured to flow a first process fluid;
   a first process fluid first peripheral passage plate with a plurality of first process fluid peripheral passage holes;
   a first process fluid first plenum volume;
   a first process fluid first central passage plate with a first process fluid central passage hole; and
   a first process fluid second plenum volume, wherein:
      the first process fluid first plenum volume is bounded, at least in part, by a first surface of the first process fluid cap plate and a first surface of the first process fluid first peripheral passage plate offset from the first surface of the first process fluid cap plate by a first offset distance,
      the first process fluid first plenum volume fluidically connects the first inlet and the first process fluid peripheral passage holes,
      the distance from the first inlet to at least one of the peripheral passage holes is at least three times greater than the first offset distance,
      the first process fluid second plenum volume is bounded, at least in part, by a first surface of the first process fluid first central passage plate and a second surface of the first process fluid first peripheral passage plate offset from the first surface of the first process fluid first central passage plate and on a side of the first process fluid first peripheral passage plate opposite the first surface of the first process fluid first peripheral passage plate, and
      the first process fluid second plenum volume fluidically connects the first process fluid central passage hole and the first process fluid peripheral passage holes.

2. The vaporizer of claim 1, wherein the first process fluid first peripheral passage plate comprises a first material with a thermal conductivity above 100 W/m/K.

3. The vaporizer of claim 2, wherein the first material is selected from the group consisting of CVD silicon carbide, aluminum, and copper.

4. The vaporizer of claim 1, wherein the first process fluid first peripheral passage plate comprises:
a core structure made of a first material, and
an outer skin made of a second material, wherein:
the outer skin is interposed between the core structure and the first process fluid when the first process fluid is flowed through the vaporizer, and
the second material is chemically non-reactive with the first process fluid under normal operating conditions of the vaporizer.

5. The vaporizer of claim 4, wherein the first material is selected from the group consisting of copper and aluminum.

6. The vaporizer of claim 4, wherein the second material is a coating applied to the core structure.

7. The vaporizer of claim 1, wherein the first process fluid first peripheral passage plate further comprises:
an internal flow inlet fluidically connected to a flow path internal to the first process fluid first peripheral passage plate;
an internal flow outlet fluidically connected to the flow path; and
the flow path, wherein the flow path is:
fluidically interposed between the internal flow inlet and the internal flow outlet,
fluidically isolated from the first process fluid peripheral passage holes, and
configured to flow a heat transfer fluid through the first process fluid first peripheral passage plate.

8. The vaporizer of claim 1, further comprising:
a first process fluid second peripheral passage plate with a plurality of first process fluid peripheral passage holes; and
a first process fluid third plenum volume, wherein:
the first process fluid third plenum volume is bounded, at least in part, by a second surface of the first process fluid first central passage plate on a side of the first process fluid first central passage plate opposite the first surface of the first process fluid first central passage plate and a first surface of the first process fluid second peripheral passage plate offset from the second surface of the first process fluid first central passage plate, and
the first process fluid second plenum volume fluidically connects the first process fluid central passage holes and the first process fluid peripheral passage holes of the first process fluid second peripheral passage plate.

9. The vaporizer of claim 1, further comprising a first heating element configured to heat the first process fluid first peripheral passage plate.

10. The vaporizer of claim 9, wherein the first heating element is in thermally-conductive contact with at least a portion of an outer perimeter of the first process fluid first peripheral passage plate.

11. The vaporizer of claim 1, further comprising:
a second process fluid cap plate with a second inlet configured to flow a second process fluid;
a second process fluid first peripheral passage plate with a plurality of second process fluid peripheral passage holes;
a second process fluid first plenum volume;
a first outlet; and
an outlet plenum volume, wherein:
the second process fluid first plenum volume is bounded, at least in part, by a first surface of the second process fluid cap plate and a first surface of the second process fluid first peripheral passage plate offset from the first surface of the second process fluid cap plate by a second offset distance,
the second process fluid first plenum volume fluidically connects the second inlet and the second process fluid peripheral passage holes, and
the outlet plenum volume is:
a) fluidically interposed between the first process fluid first plenum volume and the second process fluid first plenum volume,
b) fluidically interposed between the first process fluid first plenum volume and the first outlet, and
c) fluidically interposed between the second process fluid first plenum volume and the first outlet.

12. The vaporizer of claim 11, further comprising a mixer located within the outlet plenum volume, the mixer including one or more baffles and configured to facilitate mixing of the first process fluid and the second process fluid within the outlet plenum volume.

13. The vaporizer of claim 11, further comprising:
a second process fluid first central passage plate with a first second gas central passage hole; and
a second process fluid second plenum volume, wherein:
the second process fluid second plenum volume is bounded, at least in part, by a first surface of the second process fluid first central passage plate and a second surface of the second process fluid first peripheral passage plate offset from the first surface of the second process fluid first central passage plate and on a side of the second process fluid first peripheral passage plate opposite the first surface of the second process fluid first peripheral passage plate, and
the second process fluid second plenum volume fluidically connects the first second gas central passage hole and the second process fluid peripheral passage holes.

14. The vaporizer of claim 11, further comprising a carrier gas source fluidically connected to the second inlet and configured to flow a carrier gas into the second process fluid first plenum volume.

15. The vaporizer of claim 11, further comprising a second heating element configured to heat the second process fluid first peripheral passage plate.

16. The vaporizer of claim 1, further comprising a first spacer interposed between the first process fluid cap plate and the first process fluid first peripheral passage plate, wherein:
the first spacer is a thin plate with an opening that forms a continuous perimeter around the first process fluid peripheral passage holes,
the first spacer has a first spacer thickness that defines, at least in part, the first offset distance.

17. The vaporizer of claim 16, further comprising one or more clamping features, wherein the one or more clamping features are configured to compress the first process fluid cap plate, the first spacer, and the first process fluid first peripheral passage plate together in a stacked arrangement.

18. The vaporizer of claim 17, further comprising a plurality of through-holes, wherein:
the one or more clamping features include a plurality of fasteners:
each fastener includes a threaded portion and a fastening portion configured to screw onto the threaded portion;
the through-holes are configured to allow one of the fasteners to pass through; and the through-holes are in one or more of the plates selected from the group consisting of: the peripheral passage plate, the cap plate, and the spacer.

19. A vaporizer comprising:
a first process fluid cap plate with a first inlet configured to flow a first process fluid;
a first process fluid first peripheral passage plate with a plurality of first process fluid peripheral passage holes;
a first process fluid first plenum volume;
a second process fluid cap plate with a second inlet configured to flow a second process fluid;
a second process fluid first peripheral passage plate with a plurality of second process fluid peripheral passage holes;
a second process fluid first plenum volume;
a first outlet; and
an outlet plenum volume, wherein:
the first process fluid first plenum volume is bounded, at least in part, by a first surface of the first process fluid cap plate and a first surface of the first process fluid first peripheral passage plate offset from the first surface of the first process fluid cap plate by a first offset distance,
the first process fluid first plenum volume fluidically connects the first inlet and the first process fluid peripheral passage holes,
the distance from the first inlet to at least one of the peripheral passage holes is at least three times greater than the first offset distance,
the second process fluid first plenum volume is bounded, at least in part, by a first surface of the second process fluid cap plate and a first surface of the second process fluid first peripheral passage plate offset from the first surface of the second process fluid cap plate by a second offset distance,
the second process fluid first plenum volume fluidically connects the second inlet and the second process fluid peripheral passage holes, and
the outlet plenum volume:
a) fluidically interposed between the first process fluid first plenum volume and the second process fluid first plenum volume,
b) fluidically interposed between the first process fluid first plenum volume and the first outlet, and
c) fluidically interposed between the second process fluid first plenum volume and the first outlet.

20. The vaporizer of claim 19, further comprising a mixer located within the outlet plenum volume, the mixer including one or more baffles and configured to facilitate mixing of the first process fluid and the second process fluid within the outlet plenum volume.

21. The vaporizer of claim 19, further comprising:
a second process fluid first central passage plate with a first second gas central passage hole; and
a second process fluid second plenum volume, wherein:
the second process fluid second plenum volume is bounded, at least in part, by a first surface of the second process fluid first central passage plate and a second surface of the second process fluid first peripheral passage plate offset from the first surface of the second process fluid first central passage plate and on a side of the second process fluid first peripheral passage plate opposite the first surface of the second process fluid first peripheral passage plate, and
the second process fluid second plenum volume fluidically connects the first second gas central passage hole and the second process fluid peripheral passage holes.

22. The vaporizer of claim 19, further comprising a carrier gas source fluidically connected to the second inlet and configured to flow a carrier gas into the second process fluid first plenum volume.

23. The vaporizer of claim 19, further comprising a second heating element configured to heat the second process fluid first peripheral passage plate.

* * * * *